United States Patent [19]
Mitchell et al.

[11] Patent Number: 5,932,254
[45] Date of Patent: Aug. 3, 1999

[54] SYSTEM FOR ENCAPSULATING MICROELECTRONIC DEVICES

[75] Inventors: Craig Mitchell, Coral Springs, Fla.; Thomas H. Distefano, Monte Sereno, Calif.

[73] Assignee: Tessera, Inc., San Jose, Calif.

[21] Appl. No.: 09/012,079

[22] Filed: Jan. 22, 1998

Related U.S. Application Data

[62] Division of application No. 08/532,235, Sep. 22, 1995, Pat. No. 5,766,987.

[51] Int. Cl.⁶ .................................................. B29C 45/14
[52] U.S. Cl. ........................ 425/117; 249/105; 249/137; 264/272.15; 264/272.17; 425/129.1; 425/127; 425/543; 425/546
[58] Field of Search ................................. 425/116, 425, 425/129.1, 117, 543, 544, 546; 264/272.15, 272.17; 249/137, 84, 85, 91, 105

[56] References Cited

U.S. PATENT DOCUMENTS

| | | | |
|---|---|---|---|
| 428,558 | 5/1890 | Field, Jr. ................................. | 249/105 |
| 2,136,840 | 11/1938 | Buckler ................................... | 249/137 |
| 3,266,125 | 8/1966 | Tobolski ............................. | 264/272.17 |
| 4,374,080 | 2/1983 | Schroeder ............................... | 264/102 |
| 4,560,138 | 12/1985 | DePuglia et al. ....................... | 425/116 |
| 4,712,765 | 12/1987 | Sabet ...................................... | 425/117 |
| 4,900,501 | 2/1990 | Saeki et al. ........................ | 264/272.17 |
| 4,915,607 | 4/1990 | Medders et al. ......................... | 425/116 |
| 4,944,908 | 7/1990 | Leveque et al. .................... | 264/272.17 |
| 5,032,543 | 7/1991 | Black et al. ........................ | 264/272.17 |
| 5,052,907 | 10/1991 | Matumoto et al. ...................... | 425/116 |
| 5,148,265 | 9/1992 | Khandros et al. ......................... | 357/80 |
| 5,148,266 | 9/1992 | Khandros et al. ......................... | 357/80 |
| 5,258,330 | 11/1993 | Khandros et al. ......................... | 29/593 |
| 5,302,101 | 4/1994 | Nishimura ................................ | 425/116 |
| 5,371,044 | 12/1994 | Yoshida et al. .................... | 264/272.17 |
| 5,398,863 | 3/1995 | Grube et al. ............................. | 228/106 |
| 5,407,505 | 4/1995 | Groenewegen et al. ........... | 264/272.17 |
| 5,409,362 | 4/1995 | Neu ......................................... | 425/116 |
| 5,409,866 | 4/1995 | Sato et al. ........................... | 264/272.17 |
| 5,455,390 | 10/1995 | DiStefano et al. ...................... | 174/262 |
| 5,477,611 | 12/1995 | Sweis et al. .............................. | 29/840 |
| 5,665,653 | 9/1997 | Bare et al. .......................... | 264/272.17 |

FOREIGN PATENT DOCUMENTS 62-162337  7/1987  Japan ................. 264/272.17

*Primary Examiner*—Robert Davis
*Attorney, Agent, or Firm*—Lerner, David, Littenberg, Krumholz & Mentlik, LLP

[57] ABSTRACT

A fixture for encapsulating microelectronic devices includes a structure defining a device-receiving pocket and a well communicating with the pocket so that the passage and well define an interior space whereby the pocket is disposed above the well when the structure is in a first orientation and the well is disposed above the pocket when the structure is in a second orientation. The fixture also includes an element for sealing the interior space and a port for connecting the sealed interior space to an evacuation device.

10 Claims, 4 Drawing Sheets

SYSTEM FOR ENCAPSULATING MICROELECTRONIC DEVICES

This is a divisional of U.S. patent application Ser. No. 08/532,235 filed Sep. 22, 1995 and now U.S. Pat. No. 5,766,987.

BACKGROUND OF THE INVENTION

The present invention relates to the field of microelectronic device manufacture, and more particularly relates to methods and apparatus suitable for encapsulating microelectronic subassemblies such as semiconductor chip subassemblies.

For example, as described in commonly assigned U.S. Pat. Nos. 5,148,266; 5,148,265; 5,258,330 and 5,398,863, certain microelectronic subassemblies may incorporate a microelectronic element such as a semiconductor chip, a dielectric layer such as a flexible, sheet-like dielectric with terminals thereon connected to the microelectronic element or semiconductor chip and a layer of a compliant material disposed between the dielectric layer and the semiconductor or microelectronic element. Such compliant layer can be formed, in whole or in part, by injecting a curable liquid material between the dielectric and the chip or microelectronic element. The curable liquid encapsulant may also serve to encapsulate the flexible leads. Specific methods for introducing encapsulant are disclosed in co-pending, commonly assigned U.S. Pat. No. 08/123,882, filed Sep. 20, 1993; 08/246,113, filed May 19, 1994 and 08/366,236 filed Dec. 28, 1994. As further described in co-pending, commonly assigned U.S. Pat. No. 08/271,768, filed Jul. 7, 1994, the microelectronic assembly may be fabricated by connecting leads between the terminals on the dielectric element and the microelectronic element and then moving the dielectric element and microelectronic element relative to one another to thereby deform the leads. Assemblies of this type may also be provided with a compliant layer by injection of a liquid encapsulant between the dielectric layer and the microelectronic element.

A further process for encapsulation of microelectronic elements is taught in U.S. Pat. No. 4,374,080. In this process, the devices to be encapsulated are disposed in mold cavities which are filled with a fine, powder filler through a filling orifice initially disposed at the top of the cavity. After addition of the filler, the cavities are inverted to drain off excess powder filler while still leaving some powder filler in the mold cavities surrounding the device. Following this, the liquid encapsulant is added and a vacuum is drawn so that gases trapped in the molding cavity, between the particles of filler, bubble up through the encapsulant. After degassing, the encapsulant is cured.

Other methods of encapsulation include transfer molding and injection molding. In these methods, the subassembly is positioned within a mold cavity and the encapsulating material is forced into the cavity around the subassembly. If the encapsulant is an elastomer which requires substantial curing time, each subassembly must remain in the mold for a prolonged period. Consequently, productivity of these methods is limited. In a "glob-top" encapsulation process, the encapsulant is applied over the chip and the surrounding region of the substrate without a mold. The glob-top process cannot be used with certain types of assemblies.

Despite these and other efforts in the art, there has been need for further development of encapsulation fixtures and methods. In particular, further improvement in encapsulation fixtures and methods capable of processing numerous semiconductor devices would be desirable. There are particular needs for fixtures and methods which are usable with encapsulants such as elastomers having long cure times.

SUMMARY OF THE INVENTION

The present invention addresses these needs.

One aspect of the present invention provides methods of encapsulating a plurality of microelectronic subassemblies. Each subassembly includes a dielectric layer overlying a microelectronic element and having a top surface facing away from the microelectronic element. The subassembly also includes terminals on a top surface of the dielectric layer and electrically conductive leads connecting the terminals to contacts on the microelectronic element. In the method according to this aspect of the invention, the subassemblies are disposed side-by-side with one another so that the microelectronic elements are side-by-side and so that the dielectric layers are also disposed side-by-side in coplanar arrangement. The dielectric layers define openings. The dielectric layers of the various subassemblies may be separate from one another and may define openings therebetween. The dielectric layers of the various subassemblies may further have openings through the dielectric layer associated with each subassembly.

The methods according to this aspect of the present invention further include the step of filling a liquid composition such as an encapsulant between the dielectric layers and the microelectronic elements of the subassemblies while substantially preventing flow of the liquid onto the top surfaces of the dielectric layers through the openings defined between or within the dielectric layers. Most preferably, the method according to this aspect of the present invention includes the step of applying a top covering layer, such as a substantially imperforate layer, extending over the top surfaces of the various dielectric layers and occluding the openings. Thus, the top covering layer serves to prevent flow of the liquid onto the top surfaces during the filling step. After the filling step, the liquid preferably is cured to a gel or a solid, and most preferably to a compliant gel or solid. The top covering layer may then be removed. Alternatively, the top covering layer may remain as an integral part of the subassembly. Preferably, the step of providing the top covering layer includes the step of providing a solid layer and a layer of a soft sealant so that the sealant is disposed between the solid layer and the dielectric layers of the various subassemblies. The sealant substantially encapsulates the terminals. The sealant may be an adhesive and may secure the solid layer to the subassemblies.

In preferred methods according to this aspect of the invention, the top covering layer serves to seal the openings defined by the dielectric layers so that the subassemblies can be treated as a unit having a substantially continuous, imperforate dielectric layer. The top covering layer prevents continuation of the terminals, and thus makes the terminals ready for connection to another device in subsequent use of the subassemblies.

A method according to a further aspect of the invention includes the step of providing plural microelectronic subassemblies, each incorporating a dielectric layer overlying a microelectronic element, terminals on the dielectric layer and leads connecting the terminals to contacts on the microelectronic elements, the subassemblies again being disposed side-by-side so that the microelectronic elements are side-by-side with one another and so that the dielectric layers are also disposed side-by-side in coplanar arrangement. In a method according to this aspect of the present invention, the microelectronic elements are separate from one another and hence define openings between them. The microelectronic elements have bottom surfaces facing away from the dielectric layers. The method according to this aspect of the present invention also includes the step of filling a liquid composition between the dielectric layers and the microelectronic elements and in this case substantially preventing flow of the liquid onto the bottom surfaces of the microelectronic elements through the openings therebetween. Most preferably, a method according to this aspect of the present invention includes the step of providing a bottom covering layer overlying the bottom surfaces of the microelectronic elements and occluding the openings therebetween, so that the bottom covering layer prevents flow of the liquid material. This prevents contamination of the bottom surfaces and thus facilitates proper mounting of the microelectronic elements during service.

Methods according to the present invention may involve practice of both of the aforementioned aspects. That is, both a top covering layer and a bottom covering layer may be provided. In other methods, only one such covering layer may be employed. For example, where the dielectric layers of the various subassemblies are both imperforate and integral with one another, the top covering layer may be omitted and only the bottom covering layer may be employed. Conversely, where the microelectronic elements of the various subassemblies are integral with one another, as where the microelectronic elements are semiconductor chips formed as part of a common wafer, the bottom covering layer may be omitted and only the top covering layer may be employed. Most preferably, the subassemblies are disposed side-by-side between a bottom fixture element and a top fixture element so that the top surfaces of the dielectric layers face towards the top fixture element and the bottom surfaces of the microelectronic elements face toward the bottom fixture element during the filling step. The top covering layer, where employed, may be disposed between the dielectric layers and the top fixture element during the filling step. As further described below, the liquid may be forced under pressure between the dielectric layers and the microelectronic elements so as to force the dielectric layers towards the top fixture and thereby bring the dielectric layers into substantially planar configurations.

A method for encapsulating one or more microelectronic devices according to a further aspect of the present invention includes the step of placing the microelectronic devices into a device-receiving pocket of a fixture and placing a liquid encapsulant in a well of the fixture while the fixture is in a first orientation. In this first orientation, the well extends downwardly and the liquid is confined by gravity in the well. The method further includes the step of sealing the fixture and evacuating air from within the fixture to thereby degas the encapsulant and remove air from around the microelectronic device. Following evacuation, while the fixture remains sealed, the fixture is turned to a second orientation to thereby pour the liquid encapsulant into the device-receiving pocket so that the liquid encapsulant contacts the microelectronic devices. The liquid encapsulant is then cured to a solid or gel. The microelectronic devices used in methods according to this aspect of the present invention may include the plural microelectronic subassemblies discussed above. The fixture may incorporate a bottom element defining the support surface and preferably also incorporating the well, and the placing step may include the step of providing the subassemblies as a panel connected to one another, as by the top and bottom cover layers discussed above onto the support surface. A top element may then be assembled to the bottom element after the panel is disposed between the top element and the bottom element. Where the panel of microelectronic subassemblies includes a top covering layer overlying the dielectric layer of the various subassemblies, the step of sealing the fixture may include the step of sealing the top covering layer to the bottom element of the fixture, as by a resilient gasket. Most preferably, the method includes the step of injecting a gas under pressure into the sealed fixture after the fixture is turned to its second orientation, above the level of the liquid encapsulant, and maintaining the gas in the fixture under pressure while the liquid is cured. As further discussed below, this provides a void-free encapsulation and also aids in bringing the dielectric layers of the various subassemblies to a planar configuration. Because the encapsulant is contained in the well during the evacuation step, before the fixture is turned, entrained and suspended gases in the encapsulant can be drawn off readily,. The encapsulant is not confined within the relatively narrow spaces defined by the microelectronic elements and therefore can be effectively degassed. Also, because the encapsulant is not present in contact with the microelectronic devices during this evacuation step, gas can be readily drawn from any spaces defined by the devices or between the devices and the fixture. The encapsulant will not obstruct gas removal from the devices, and the devices will not obstruct gas removal from the encapsulant.

Yet another aspect of the present invention provides a fixture for encapsulation of microelectronic devices. A fixture according to this aspect of the invention incorporates a structure defining a device-receiving pocket, and a well communicating passage with the pocket so that the passage and the well define an interior space. The pocket is disposed above the well when the structure is in a first orientation, whereas the well is disposed above the pocket when the structure is in its second orientation. The fixture according to this aspect of the invention desirably also includes means for sealing the interior space from the exterior environment and a port for connecting the sealed interior space to an evacuation device. The port preferably is equipped with a value. Preferably, each fixture according to this aspect of the invention includes a bottom element and a top element, the bottom element incorporating a support surface facing upwardly when the structure is in its first orientation, the bottom element also defining the well. The well desirably extends generally downward from the support surface when the structure is in the first orientation. The top element desirably is releasably secured to the bottom element and defines a bottom surface facing towards the bottom element when the top element is secured to the bottom element, so that the support surface of the bottom element and the bottom surface of the top element cooperatively define the device-receiving pocket. A system of production tooling according to further aspect of the invention desirably includes a plurality of fixtures as described, a dispense station including means such as a rack or table for holding one or more such fixtures in its first orientation and a dispenser for dispensing a liquid encapsulant into the wall of each such fixture. The system further includes a curing holder for holding at least some of the fixtures, and preferably a plurality of such fixtures, in the second orientation. Thus, each fixture can be filled with the encapsulant, and loaded with the microelectronic element devices while in its first orientation and then cured in the second orientation. The system desirably further includes a vacuum source and a fitting for temporarily connecting the vacuum source to the port of each fixture while the fixture is in the first orientation as well as a gas charging device including a source of gas under pressure and connectable to the same fitting or to a different fitting for temporarily connecting the gas source to the port of each fixture while the fixture is in the second orientation. Preferably, each fixture defines a chamber which is in communication with its interior space, the chamber disposed above the pocket when the structure is in its second orientation. The gas held in each chamber can maintain pressure on the liquid encapsulant during curing.

These and other objects, features and advantages of the present invention will be readily apparent from the detailed description of the preferred embodiments set forth below, taken in conjunction with the accompanying drawings.

DETAILED DESCRIPTION OF THE PREFERRED EMBODIMENTS

Figure 1:
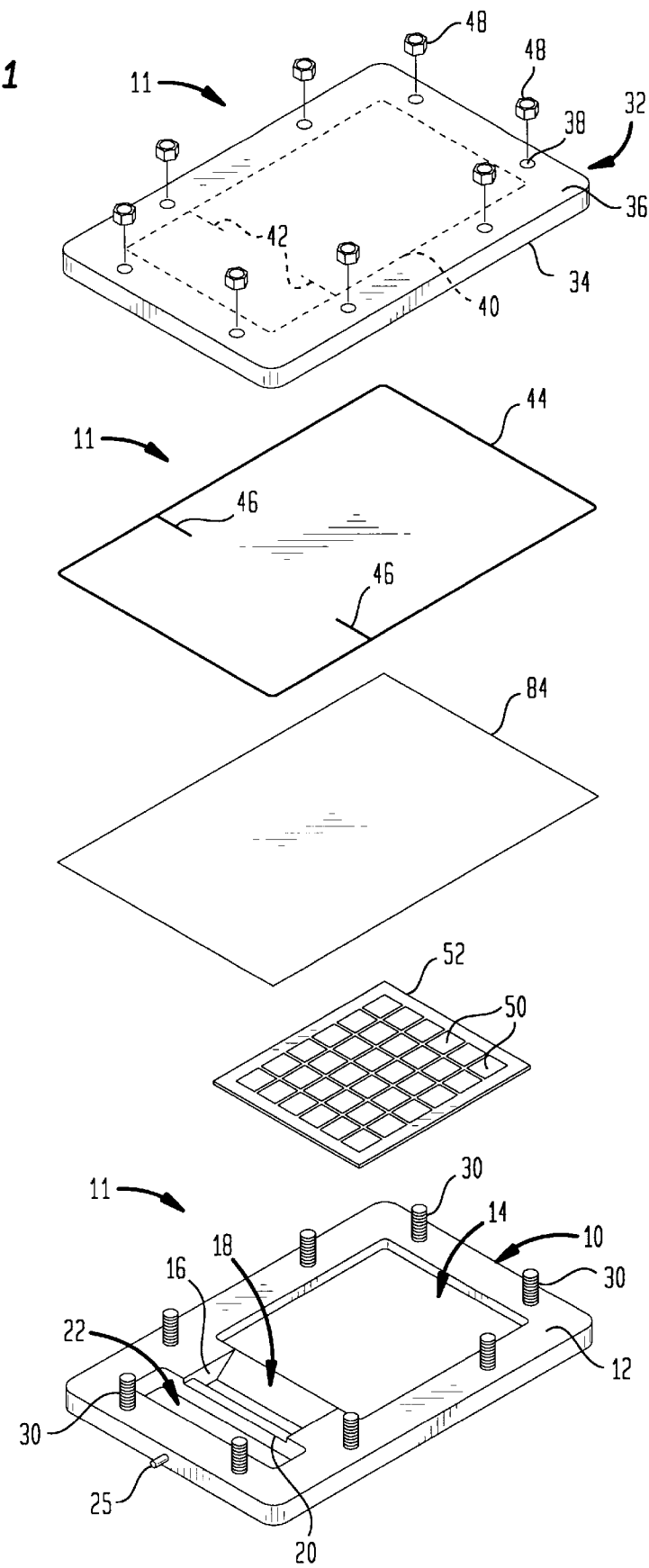
FIG. 1 is an exploded perspective view depicting a fixture in accordance with one embodiment of the invention.
Figure 3:
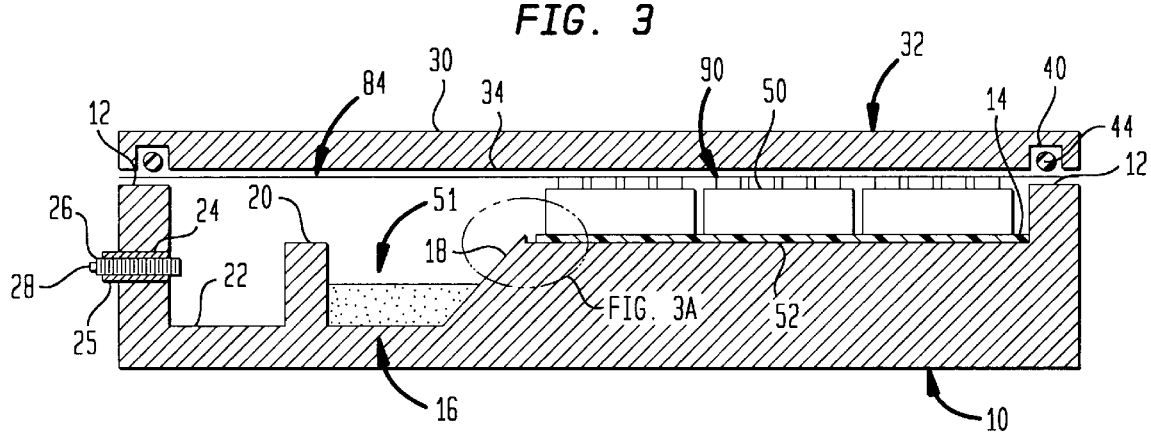
FIG. 3 is a diagrammatic sectional view depicting the fixture of FIG. 1 during one stage of the process depicted in FIG. 2, with devices being processed.
Figure 3A:
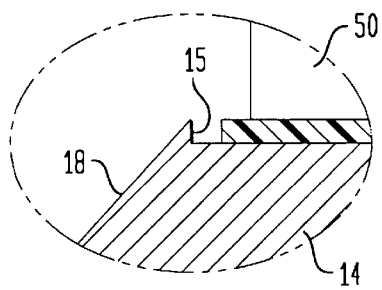
FIG. 3A is a diagrammatic sectional view on an enlarged scale of the region indicated in FIG. 3.

A fixture in accordance with one embodiment of the invention includes a bottom fixture element 10 generally in the form of a plate and made from a metallic material such as stainless steel. Bottom fixture element 10 defines a planar parting surface 12 on a first side of the plate. In the first or generally horizontal orientation of the plate shown in FIG. 1, parting surface 12 faces upwardly. The parting surface extends around the perimeter of the plate. A planar support surface 14 is disposed on the same side of the plate as the parting surface. The support surface is recessed slightly relative to the parting surface. A well 16 extends into the plate from the first side thereof. The well has an inclined surface 18 disposed at an angle of about 45° to the planes of the parting and support surfaces. As best seen in FIG. 3, the inclined surface of the well intersects support surface 14. The inclined surface may protrude above the support surface by a small amount, such as about 0.01 mm, to form a vertical ledge 15 (FIG. 3A). The well is open at the first side of the plate, i.e., at the side of the plate facing upwardly in FIGS. 1 and 3. In the orientation illustrated in FIGS. 1 and 3, the well 16 extends downwardly from the support surface 14. Bottom element 10 further includes a rib 20 bounding well 16 on the side of the well opposite the support surface 14 and a reservoir pocket 22 disposed on the opposite side of rib 20 from the well. The top of rib 20 is recessed relative to the parting surface 12. Thus, in the first horizontal orientation illustrated in FIGS. 1 and 3, rib 20 lies beneath the level of parting surface 12. A port 24 extends through the wall of the bottom fixture element between the outside of the fixture and reservoir pocket 22. A connection fitting 25 is connected to the port 24 and protrudes from the wall of the bottom fixture element. A spring loaded, normally closed valve 26 is mounted in the connection fitting 25 and in port 24. This valve may be of the type commonly utilized as an inflation valve for automobile tires, known in the art as a SCHRAEDER (trademark) valve. The valve has an actuating stem 28. The valve remains closed except when held in an open position by a force on actuating stem 28. A plurality of threaded studs 30 protrude from parting surface 12. The studs are spaced around the perimeter of the bottom fixture element.

The fixture also includes a top fixture element 32 substantially in the form of a flat plate with a lower or parting surface 34, a top surface 36, and a plurality of holes 38 extending through the plate at locations spaced around the perimeter of the plate corresponding to the locations of studs 30. As best seen in FIG. 3, the top fixture element has a sealing ring groove 40 formed in parting surface 34. The sealing ring groove includes a continuous portion extending around the perimeter just slightly inboard of holes 38, and further includes a pair of stub grooves 42 extending inwardly from opposite sides but not meeting one another. Stub grooves 42 are positioned so that they will be aligned with well 16, close to the juncture of inclined surface 18 and support surface 14 when the fixture is assembled.

A gasket 44 having a circular cross-sectional shape is also provided. Gasket 44 extends in a path corresponding to slot 40 in the bottom surface of the top fixture element. The gasket includes a pair of projections 46 corresponding to the projecting stub grooves 42. Gasket 44 is formed from any suitable elastomeric material, such as rubber. A plurality of nuts 48 are also provided. These are adapted to mate with the threads on studs 30 and hold the top and bottom elements of each fixture. Nuts 48 and studs 30 can be replaced by any other device capable of securing the top and bottom fixture elements together, such as clamps, latches, snap fasteners, spring clips or other mechanisms.

Figure 2:
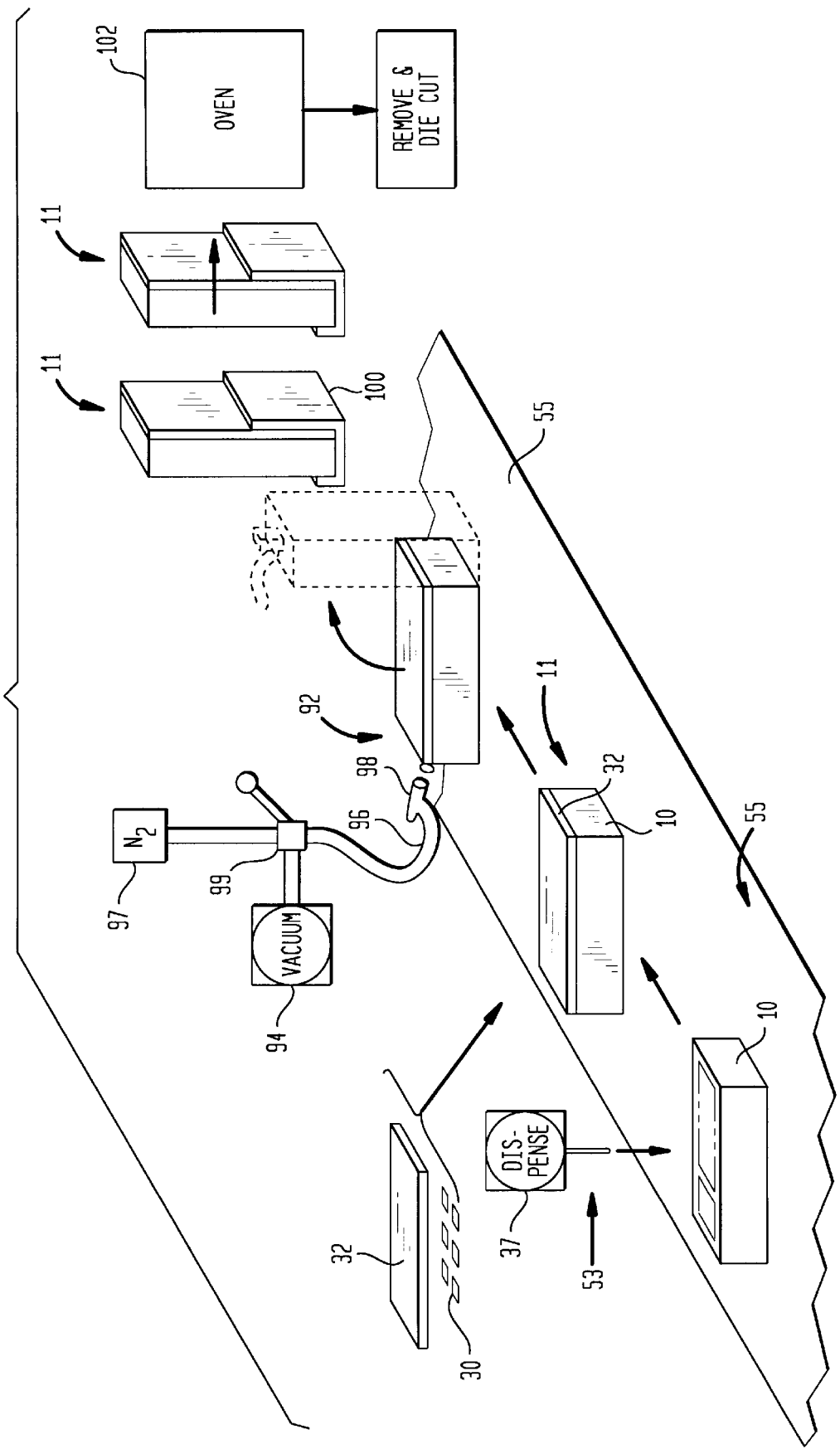
FIG. 2 is a process flow diagram depicting a process utilizing the fixture of FIG. 1.
Figure 4:
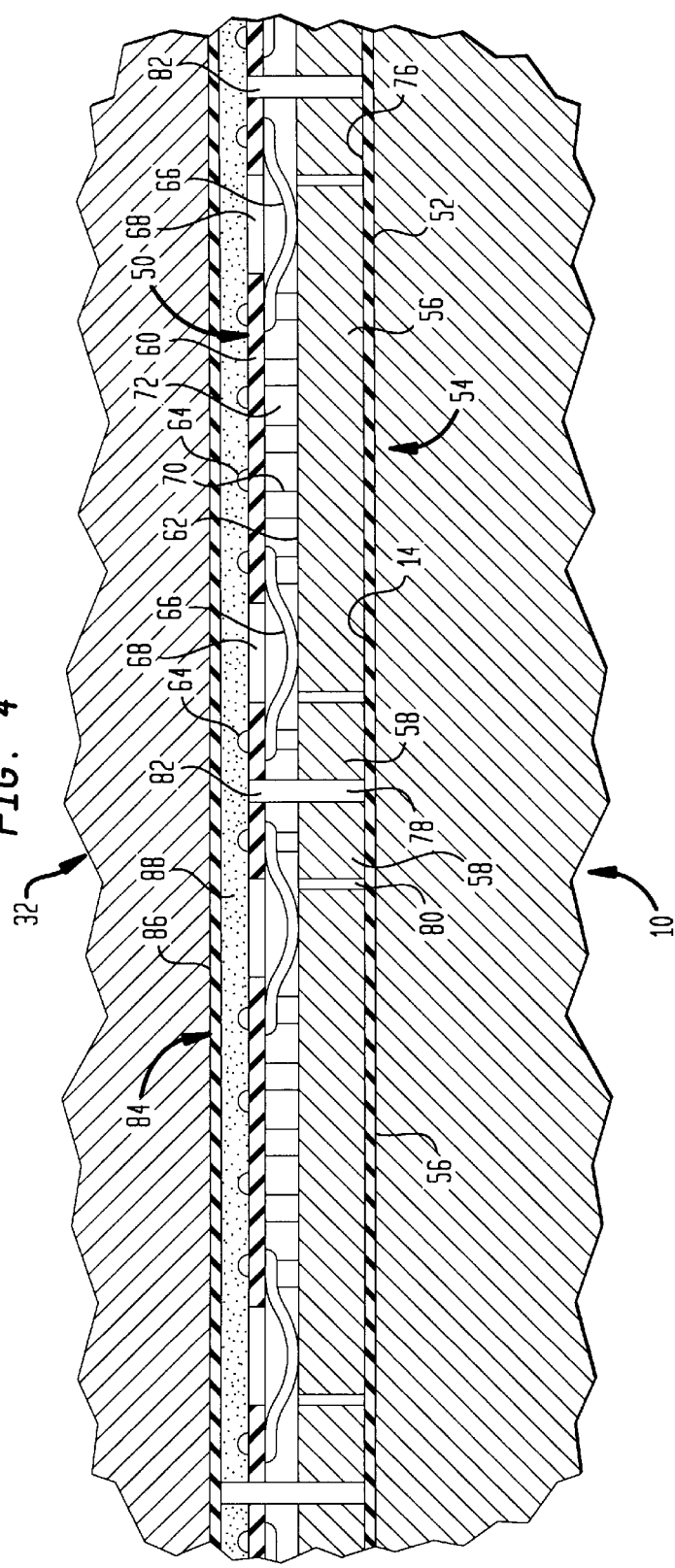
FIG. 4 is a fragmentary sectional view on an enlarged scale of the device and the fixture illustrated in FIG. 3.

In a process according to one embodiment of the invention, a plurality of fixtures as described above are employed. In the first stage of the process, a flowable liquid encapsulant 51 is placed into the well 16 of a fixture bottom element 10 at an encapsulation station 53 (FIG. 2). The encapsulant desirably is a material that can be cured to form a gel or an elastomer. The encapsulant desirably is a liquid prior to curing. For example, the encapsulant may be a silicone composition of the type sold under the trademark Sylgard 577 by the Dow Corning Corporation of Midland, Mich. The encapsulation station includes a table top or other surface adapted to support the fixture bottom element 10 in the first or horizontal orientation depicted in FIGS. 1 and 3. The dispensing station further includes a conventional liquid dispensing device 57, such as a mechanically controlled dispenser, for placing the liquid encapsulant into the well. Following encapsulant dispensing, a plurality of microelectronic subassemblies 50 are positioned on a backing element 52 or bottom covering layer, which in turn is disposed on the support surface 14 of the bottom fixture element 10. As best seen in FIG. 4, each microelectronic subassembly 50 includes a composite microelectronic element 54 including a semiconductor chip 56 surrounded by a rigid support ring 56. Each microelectronic element also includes a dielectric layer 60 extending over the top or contact bearing surface 62 of the microelectronic element. Each dielectric layer bears a plurality of terminals 64. These terminals are connected to contacts on the semiconductor chip 56 by leads 66. Each dielectric layer 64 has a gap or "bond window" 68 extending through it. Leads 66 may be connected to the chip contacts by means of bonding tool inserted through the bond window 68 during fabrication of the subassemblies. The bonding process is described in greater detail in International Patent Publication WO94103036. At the inception of the present encapsulation process, each dielectric layer 60 is supported above the front or contact bearing surface 62 of the microelectronic element by a plurality of spaced apart elastomeric elements 70. As described in greater detail in co-pending, commonly assigned U.S. patent application 08/366,236, the disclosure of which is hereby incorporated by reference herein, elastomeric elements 70 may be formed on the dielectric layer prior to its assembly with the microelectronic element. At the inception of the encapsulation process, the spaces 72 between the elastomeric elements and between the dielectric layer 60 and microelectronic element surface 62 are unfilled.

The bottom covering layer 52 preferably is an adhesive tape adapted to adhere to the bottom surfaces 76 of the microelectronic elements. The adhesive tape may also adhere to the support surface 14 of the fixture of bottom element. The microelectronic subassemblies 50 are disposed in an array, side-by-side with one another, on the support surface 14, with the tape or bottom covering layer 52 disposed between the microelectronic elements and the support surface. As best seen in FIG. 4, the dielectric elements 60 and the terminal 64 thereon face upwardly, away from the support surface. The microelectronic elements are disposed side-by-side next to one another and define openings 78 therebetween. Each microelectronic element also has an opening 80 between its semiconductor chip 56 and support ring 58. All openings 78 and 80 are sealed by the bottom covering layer.

Likewise, the dielectric elements 60 are disposed side-by-side with one another and substantially coplanar with one another. The dielectric layers 60 of adjacent subassemblies define openings 82 therebetween. The bond windows 68 within the dielectric layer of the subassemblies provides further openings. A top covering layer 84 is applied over the array of subassemblies. Covering layer 84 includes a solid, flexible layer 86 and a layer of a soft adhesive material 88. The top covering layer is applied with the adhesive side facing the dielectric elements 60, so that the adhesive covers the top surface of each dielectric element and encapsulates the terminals on each such top surface. In the embodiment illustrated, the top covering layer 84 is a material of the type commonly referred to as "coverlay" in the semiconductor industry. The coverlay material includes a polymide solid sheet 86 and releasable adhesive 88. The top covering layer extends outwardly in horizontal directions beyond the array of subassemblies 50. Preferably, the bottom covering layer 52, microelectronic subassemblies 50, and top covering layer 84 are assembled separately from the fixture. Thus, the microelectronic elements may be placed on to the lower covering layer and the top covering layer then may be laminated onto the top of the microelectronic subassemblies. There is no particular need for precise placement of the microelectronic subassemblies relative to one another or relative to the covering layers. However, the microelectronic subassemblies desirably are placed in a regular pattern, using a straight edge or other alignment fixture or a robotic placement device (not shown).

The preassembled covering layers and microelectronic subassemblies are then placed onto the support surface 14. As best seen in FIG. 3, the top covering layer 84 extends over the parting surface 12 of the bottom fixture element 10. The top fixture element 32 and gasket 44 are then placed over layer 34. Gasket 44 overlies the top surface of the top covering layer, and is engaged between the bottom or parting surface 34 of top fixture element 32 and parting surface 12 of the bottom fixture element. Although the top fixture element 32 and bottom fixture element 10 are illustrated as spaced apart from one another in FIG. 3 for clarity of illustration, it should be understood that nuts 48 and studs 30 (FIG. 1) cooperatively clamp the top fixture element onto the bottom fixture element, thus compressing gasket 44 it and the top covering layer between the parting surfaces of the two fixture elements, and forming a substantially air-tight seal around the perimeter of the fixture. As the top fixture element is engaged with the bottom fixture element, the top fixture element 32 bears on the terminals 64 and dielectric layers 60 of the subassemblies through the top covering layer 84, and compresses the elastomeric elements 70 between the dielectric layers and microelectronic elements. The elastomeric elements thus hold the terminals and dielectric layers in engagement with the top fixture element 32 and top covering layer 84. This brings the terminals of each subassembly to a substantially coplanar alignment with one another, and brings the dielectric layer of each subassembly to a substantially planar condition. When the top fixture element and the bottom fixture element are in this assembled condition, they cooperatively define a pocket 90 (FIG. 3) which holds the microelectronic assemblies. This pocket communicates with well 16 and with reservoir chamber 22. However, at this stage of the process, the fixture remains in the first or horizontal orientation shown in FIG. 3, and hence, the liquid encapsulant 51 remains in the bottom of well 16.

Figure 5:
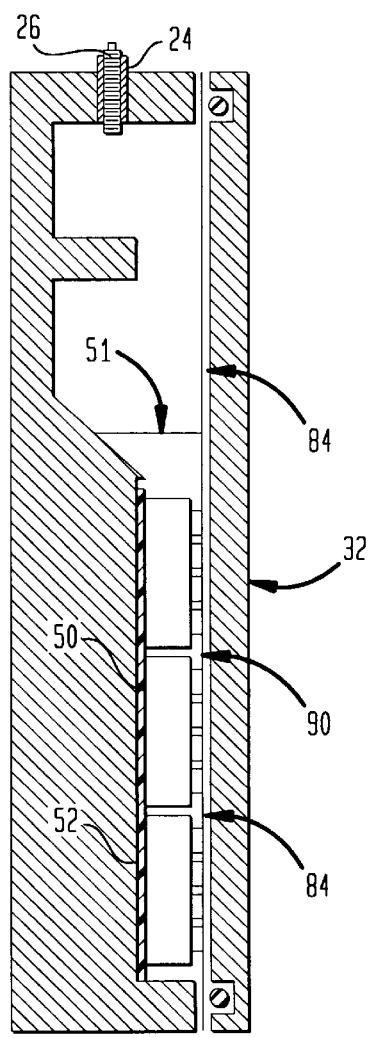
FIG. 5 is a view similar to FIG. 3, but depicting the fixture and devices at a later stage in the process.

Following assembly, the fixture is advanced to an evacuation and pressurization station 92. Station 92 incorporates a conventional vacuum source 94, which may incorporate either a conventional vacuum pump and receiver or a device for connecting to a plant vacuum piping system. The evacuation and pressurization station further includes a flexible hose 96 with a fitting 98. The evacuation/pressurization station further includes a source of compressed gas 97 such as a conventional tank containing compressed nitrogen equipped with conventional pressure regulators and safety devices (not shown) as well as a selector valve 99 connected to the vacuum source and to the pressurized gas source, and arranged to selectively connect hose 96 either to the vacuum source or the gas source. The evacuation station also includes a further portion of the table top 55 adapted to hold the fixture in the horizontal orientation. Fitting 98 may be a conventional fitting, of the type commonly referred to as a "air check", adapted to engage fitting 25 and valve actuating stem 28. While the fixture is in the horizontal position, fitting 98 is mated with fitting 25 and stem 28. In this condition, valve 26 is held open and the space within reservoir 22, well 20, and pocket 90 is evacuated. Air is withdrawn from the spaces 72 between the elastomeric element 70 of the microelectronic subassemblies (FIG. 4) as well as from all of the surrounding gaps and openings. At the same time, any gases dissolved or entrained in liquid encapsulant 51, are drawn out by the vacuum. The degassing process is continued for a time sufficient to substantially eliminate the entrained gases from the liquid and allow any foaming to subside. With a low-viscosity encapsulant, only about 20 seconds are required for the degassing process. Once the degassing process is complete, and while the interior of the fixture is still maintained under vacuum, the fixture is tilted from the first horizontal position depicted in FIG. 3 to the vertical or second orientation depicted in FIG. 5. The causes the encapsulant 51 to pour from well 16 into pocket 90. The liquid encapsulant thus fills in all of the spaces between and within the microelectronic assemblies, including the spaces 72 between the elastomeric elements 70. Desirably, the vacuum is maintained for about 30 seconds after the fixture is tilted to the vertical or second position, thus allowing the level of the liquid encapsulant to stabilize as illustrated in FIG. 5. Once the liquid level has stabilized, selector valve 99 is actuated to disconnect the vacuum source 94 and to connect the pressurized gas source 97 to hose 96 and hence to port 24. The pressurized gas fills the interior space within the chamber. The gas pressure within the interior space desirably is increased to about 10 atmospheres. The gas pressure tends to force the liquid encapsulant 51 downwardly into the pocket 90 and hence to force the liquid encapsulant into even more intimate contact with a microelectronic subassemblies. The top covering layer 84 prevents the liquid encapsulant from flowing onto the top surfaces of dielectric layers 60 through the openings 68 and 82 thus prevents contamination of terminal 64. Likewise, the bottom covering layer 52 prevents any flow of encapsulant onto the bottom surfaces of the microelectronic elements through openings 80 and 78 defined by the microelectronic elements. This leaves the bottom surfaces of the microelectronic elements free from encapsulant contamination. However, the encapsulant fills the opening 80 and 78.

The fluid pressure tends to force the top covering layer 84 and dielectric layers 60 against the top fixture element 32. This supplements the action of the elastomeric elements 70 and further assures that the dielectric layers 60 and terminals 64 of each subassembly will be brought to a substantially planar condition. In alternative embodiments, the elastomeric elements 70 can be omitted, and the dielectric layers can be planarized by the applied fluid pressure. A vacuum may be applied between the top fixture element 32 and the top covering layer 84 to assist in this action. The fixture is maintained in this vertical or second orientation, and disconnected from the compressed gas source. The valve 26 closes, thus maintaining the gas pressure within the fixture. While the fixture is maintained in this vertical or second orientation, it is transferred to a curing station having a rack or holder 100 adapted to maintain the fixture in the vertical or second orientation. The curing station may also include an oven 102 for heating the fixture to accelerate cure of the encapsulant.

The fixture is held in the curing station for a time sufficient to cure the encapsulant to a solid or gel. The encapsulant desiredly cures to form an elastomeric solid or gel. The cured encapsulant merges with the elastomeric elements 70 (FIG. 4) of the microelectronic assemblies to form a composite compliant layer between the dielectric layer 60 and the front or contact bearing surface 62 of the microelectronic element. After curing, nuts 48 are released and the fixture is disassembled. The cured, composite assembly including the top covering layer 84, bottom covering layer 52, and microelectronic devices 50 is removed from the fixture. The top and bottom covering layers are stripped off and the microelectronic devices are separated from one another by cutting through the cured encapsulant at the gaps 82 and 78 between adjacent microelectronic subassemblies. This cutting operation can be performed by a die or blade. The cutting operation need only be precise enough to avoid damage to the elements of the microelectronic devices. The finished devices are then ready for use. As described, for example, in the aforementioned commonly assigned international patent publication, the terminals on the dielectric element can be connected to a larger substrate to provide a flexible compliant mounting for the microelectronic element. Although the process has been described above with reference to operations performed or a single fixture 11, the process equipment desirably includes numerous fixtures. While one fixture 11 is at the dispense station, another is at the evacuation and pressurization station, others are in the curing station. The individual fixtures are relatively inexpensive and hence, a number of fixtures can be provided at reasonable cost. Thus, even where the process involves prolonged curing times, reasonable throughout can be achieved with a relatively modest capital investment. Also, the fixtures need not be customized for the particular microelectronic subassemblies. The same fixtures can be used with the subassemblies of different configurations.

The processes described above can be varied. The coverlay material utilized at the top covering layer may be replaced by other materials such as those commonly used in the semiconductor industry as solder mask layers; by cellulosic materials or by other thermoplastic materials. The thermoplastic materials may be laminated by and/or heat and pressure so that the thermoplastic materials intimately cover the top surfaces of the dielectric layers and encapsulate the terminals. The bottom covering layer may incorporate any of the materials discussed above with reference to the top covering layer. Also, the bottom covering layer, and top covering layer, or both, may be formed from materials which are soluble in solvents which do not attack the materials of the microelectronic device or the cured encapsulant. For example, where the covering layers are formed from water-soluble polymers such as cellulose, they may be removed by exposure to water. Numerous other combinations of polymers and solvents are known. The covering layers may be peeled away from the subassemblies, rather than dissolved. The covering layers used in this process desirably include a peelable adhesive of the types commonly used in peelable masking layers.

Alternatively, the top covering layer, the bottom covering layer or both may be left in place as part of each microelectronic subassembly. Thus, when the subassemblies are separated from one another, the top covering layer can be severed at locations corresponding to the gaps between dielectric layers leaving a piece of the top covering layer in place on each of the dielectric layers. Before or after this step, the top covering layer may be selectively ablated or selectively removed using a photographic patterning process to leave openings at the areas corresponding to the terminals, thereby exposing the terminals for further connections. The photographic patterning process may be performed using a separate photosensitive mask on top of the top covering layer. Alternatively, the top covering layer itself may be photographically sensitive.

In a further variant, the top covering layer may not, itself, be continuous. Instead, the top covering layer may be applied only at the openings defined by the dielectric layer, such as the bond windows 68 and the gaps 82 between adjacent dielectric layers. The top covering layer may have holes formed therein before application to the subassemblies, as by ablation, photographic patterning or mechanical punching, in a pattern corresponding to the pattern of the terminals on the dielectric layers. When the top covering layer is applied, these holes are registered with the terminals, leaving the terminals exposed. In each of these arrangements, however, the top covering layer seals the openings 82 and 68 between and within the dielectric layers. The top covering layer thus cooperates with the dielectric layers of the various subassemblies to define a composite imperforate sheet. After curing and severance of the individual subassemblies, the top covering layer may remain in place without further processing.

The top and bottom covering layers can also be formed in place on the subassemblies, as by screen printing or stenciling a curable composition onto the dielectric elements or microelectronic elements and curing the composition. The curable composition bridges over the openings defined by the subassemblies.

Figure 6:
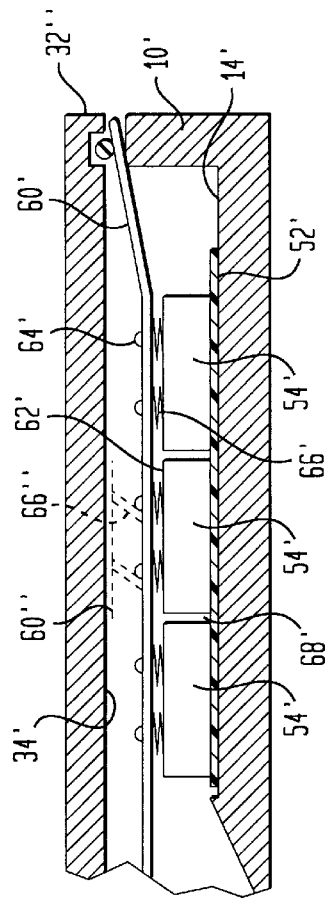
FIG. 6 is a fragmenting sectional view depicting a fixture and devices during a process in accordance with a further embodiment of the invention.

In a further variant, the dielectric layers of the individual subassemblies may be provided as elements of a unitary dielectric sheet, and that sheet may be imperforate. Thus, as shown in FIG. 6, a single, continuous dielectric layer 60' may be connected to a plurality of semiconductor chips or microelectronic elements 54' so as to form a plurality of microelectronic subassemblies. As further described in co-pending, commonly assigned United States patent application Ser. No. 08/271,768 filed Jul. 7, 1994, the disclosure of which is incorporated by reference herein, each terminal 64' on the dielectric element may be connected by means of a flexible lead 66' to a terminal on the associated chip 64'. As further described in said '768 application, each lead 66' may initially be curved in horizontal directions, parallel to the dielectric layer and parallel to the top surface 62' of the chip. Dielectric layer 60' may be imperforate apart from small holes which are completely filled by terminals 64'. As illustrated in FIG. 6, such an assemblage may be placed into a fixture substantially as described above. A bottom covering layer 52' is engaged with the bottom surfaces of all of the chips 54' and closes the gaps 78' between the chips at the bottom surfaces of the chips. The assemblage is placed into a fixture as described above, where the chips and bottom covering layer 52' are disposed on the support surface 14' of the bottom fixture element 10'. The imperforate dielectric layer 60' is engaged between the gasket 44' of the top fixture element 32' and the bottom fixture element so that the dielectric layer itself, in cooperation with the bottom fixture element cooperatively defines an enclosed sealed space in much the same way as the top covering layer and the bottom fixture element discussed above define such a space. In the process according to this embodiment of the invention, the enclosed space is evacuated and the liquid encapsulant is then reduced and pressurized in the same manner as described above. In this arrangement, the pressurized liquid encapsulant not only fills the existing spaces around the microelectronic assemblies but also forces the dielectric layer 60' upwardly into abutment with the surface 34' of the top fixture element as illustrated at 60" in broken lines in FIG. 6. The pressurized encapsulant thus forces the dielectric layer upwardly, away from each chip 54' and thereby deforms each of the leads by a predetermined amount. Stated another way, as the dielectric layer 60' moves upwardly towards the top fixture element, each of leads 66' is deformed from its starting, substantially horizontal configuration to a vertically extensive configuration as illustrated at 66" in broken lines. The liquid encapsulant serves as a fluid under pressure to drive the dielectric layer upwardly away from the microelectronic elements through a predetermined displacement to thereby deform each of the leads in a predetermined manner. To assure proper seating of the dielectric layer 60' against the upper fixture element 32', the space between the dielectric layer and the upper fixture element may be connected to a source of vacuum or vented to the atmosphere through one or more ports (not shown). Similar ports may be employed in the embodiment discussed above with reference to FIGS. 1–5. The lead-deforming action discussed above with reference to FIG. 6 can also be employed in arrangement using a separate top covering layer 84 with a perforated or separately formed dielectric layers.

In a further variant, all of the semiconductor chips may be formed as a continuous element or wafer, without gaps therebetween. In this instance, the bottom covering layer is not needed. In such an arrangement, the semiconductor chips are severed from one another after the covering step. The same severing operation may serve to sever the top covering layer or dielectric layer as required.

In yet another variant, the top or bottom covering layers may be replaced by gaskets or soft sealing layers formed as part of the fixture elements themselves. The gaskets or sealing layers serve to seal the openings between or within the dielectric layers or microelectronic elements. The top fixture element need not be isolated from the encapsulant by the top covering layer. The fixture elements can be provided with a coating of a release agent such as that sold under the trademark NiLube or other conventional release agents to facilitate removal of encapsulant after curing. As numerous variations and combinations discussed above can be utilized without departing from the present invention, the foregoing description should be taken by way of illustration rather than by way of limitation of the invention as defined by the claims.

What is claimed is:

1. A fixture for encapsulating microelectronic devices comprising:

(a) a structure defining a device-receiving pocket and a well communicating with the pocket so that the pocket and well define an interior space, the pocket being disposed above the well when said structure is in a first orientation, the well being disposed above said pocket when said structure is in a second orientation;

(b) means for sealing the interior space; and (c) a port for connecting said sealed interior space to an evacuation device.

2. A fixture as claimed in claim 1 wherein said structure includes a bottom element and a top element, said bottom element including a support surface facing upwardly when said structure is in said first orientation, said bottom element also defining said well, said well extending generally downwardly from said support surface when said structure is in said first orientation.

3. A fixture as claimed in claim 2 wherein said structure further includes a top element releasably secured to said bottom element, said top element having a bottom surface facing toward said bottom element when said top element is secured to said bottom element, said bottom surface of said top element and said support surface of said bottom element cooperatively defining said device-receiving pocket.

4. A fixture as claimed in claim 3 wherein said means for sealing said interior space includes a gasket disposed between said top and bottom elements.

5. A fixture as claimed in claim 1 wherein said structure further defines a chamber in communication with said interior space, said chamber being disposed above said pocket when said structure is in said second orientation.

6. A fixture as claimed in claim 1 further comprising a valve for selectively occluding said port.

7. A fixture as claimed in claim 6 wherein said valve is a spring-loaded, normally-closed valve.

8. A production system comprising a plurality of fixtures as claimed in claim 1, a dispense station including means for holding one said fixture in the first orientation and a dispenser for dispensing a liquid encapsulant into the well of each said fixture held by the dispense rack, while the fixture is in the first orientation, the system further including a curing holder for holding at least one said fixture in said second orientation.

9. A system as claimed in claim 8 further comprising a vacuum source and a fitting for temporarily connecting the vacuum source to the port of each said fixture while such fixture is in said first orientation.

10. A system as claimed in claim 8 further comprising a gas charging device including a source of gas under pressure and a fitting for temporarily connecting the gas source to the port of each fixture while the fixture is in the second orientation.

* * * * *

UNITED STATES PATENT AND TRADEMARK OFFICE
CERTIFICATE OF CORRECTION

PATENT NO. : 5,932,254
DATED : August 3, 1999
INVENTOR(S) : Mitchell, et. al.

It is certified that error appears in the above-identified patent and that said Letters Patent is hereby corrected as shown below:

Column 7, line 2, "WO94103036." should read --WO94/03036--

Signed and Sealed this

Fourteenth Day of November, 2000

Attest:

Q. TODD DICKINSON

Attesting Officer      Director of Patents and Trademarks